United States Patent
Yahata et al.

(10) Patent No.: US 8,552,447 B2
(45) Date of Patent: Oct. 8, 2013

(54) SEMICONDUCTOR LIGHT-EMITTING ELEMENT

(75) Inventors: Kosuke Yahata, Kiyosu (JP); Takashi Mizobuchi, Kiyosu (JP); Takahiro Mori, Kiyosu (JP); Masashi Deguchi, Kiyosu (JP); Shingo Totani, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 156 days.

(21) Appl. No.: 12/929,796

(22) Filed: Feb. 16, 2011

(65) Prior Publication Data
US 2011/0198641 A1    Aug. 18, 2011

(30) Foreign Application Priority Data

Feb. 17, 2010  (JP) ................................. 2010-032427
Nov. 24, 2010  (JP) ................................. 2010-261646

(51) Int. Cl.
  *H01L 33/42*    (2010.01)
(52) U.S. Cl.
  USPC ............... 257/98; 257/82; 257/83; 257/84; 257/85; 257/86; 257/99
(58) Field of Classification Search
  USPC ............................................... 257/98, 99, 82–86
  See application file for complete search history.

(56) References Cited

U.S. PATENT DOCUMENTS

| | | | | |
|---|---|---|---|---|
| 7,230,263 B2 * | 6/2007 | Kawagoe | ........................ | 257/13 |
| 7,268,369 B2 * | 9/2007 | Araki | ............................... | 257/83 |
| 7,719,017 B2 * | 5/2010 | Tanaka | ............................ | 257/98 |
| 7,847,312 B2 * | 12/2010 | Fudeta | ............................ | 257/99 |
| 8,063,410 B2 * | 11/2011 | Fudeta | ............................ | 257/98 |
| 8,115,222 B2 * | 2/2012 | Matsui et al. | .................... | 257/98 |
| 2006/0192223 A1 | 8/2006 | Lee et al. | | |
| 2008/0185606 A1 | 8/2008 | Sano et al. | | |
| 2009/0179215 A1 | 7/2009 | Matsui | | |
| 2009/0283787 A1 | 11/2009 | Donofrio et al. | | |
| 2010/0102342 A1 | 4/2010 | Matsui et al. | | |
| 2011/0233596 A1 | 9/2011 | Sano et al. | | |

FOREIGN PATENT DOCUMENTS

| | | |
|---|---|---|
| JP | 10-303460 | 11/1998 |
| JP | 2000-077717 | 3/2000 |
| JP | 2008-210903 A | 9/2008 |
| JP | 2009-295611 A | 12/2009 |
| WO | WO 2008/155960 A1 | 12/2008 |

OTHER PUBLICATIONS

Korean Office Action dated Jul. 24, 2012, with English translation.
Chinese Office Action dated Feb. 4, 2013 with English translation thereof.
Taiwanese Office Action and Search Report dated Jul. 18, 2013 with English translation thereof.

* cited by examiner

*Primary Examiner* — Eugene Lee
(74) *Attorney, Agent, or Firm* — McGinn Intellectual Property Law Group, PLLC

(57) ABSTRACT

A semiconductor light-emitting element includes a semiconductor laminated structure including a light-emitting layer sandwiched between first and second conductivity type layers for extracting an emitted light from the light-emitting layer on a side of the second conductivity type layer, a transparent electrode in ohmic contact with the second conductivity type layer, an insulation layer formed on the transparent electrode, an upper electrode for wire bonding formed on the insulation layer, a lower electrode that penetrates the insulation layer, is in ohmic contact with the transparent electrode and the electrode for wire bonding, and has an area smaller than that of the upper electrode in top view, and a reflective portion for reflecting at least a portion of light transmitted through a region of the transparent electrode not in contact with the lower electrode.

21 Claims, 12 Drawing Sheets

SEMICONDUCTOR LIGHT-EMITTING ELEMENT

The present application is based on Japanese Patent Application Nos. 2010-032427 and 2010-261646 filed on Feb. 17, 2010 and Nov. 24, 2010, respectively, the entire contents of which are incorporated herein by reference.

BACKGROUND OF THE INVENTION

1. Field of the Invention

The invention relates to a semiconductor light-emitting element provided with an electrode for wire bonding.

2. Description of the Related Art

A conventional semiconductor light-emitting element is known in which a buffer layer, an n-type layer, a light-emitting layer and a p-type layer are formed in this order on a substrate formed of sapphire (see, e.g., JP-A-2000-77717). The p-type layer and the light-emitting layer are partially removed by etching, an n-electrode is formed on the exposed surface of the n-type layer, and a light-transmissive p-electrode is formed on the p-type layer. An insulation film is formed on the p-type layer, a surface of the p-electrode is exposed by opening a portion of the insulation film and a pad electrode is formed on the exposed p-electrode.

In the meantime, in the semiconductor light-emitting element described in JP-A-2000-77717, a material in ohmic contact with the p-electrode needs to be selected as a material of the pad electrode, and there may be no other choice but to select a material having a low reflectance to the light emitted from the light-emitting layer. In addition, it is necessary to form the pad electrode so as to have a relatively large area in light of connection to a bonding wire. This causes a problem that an amount of light absorption by the pad electrode is large, resulting in a decrease in light extraction efficiency of an element.

SUMMARY OF THE INVENTION

Therefore, it is an object of the invention to improve light extraction efficiency of a semiconductor light-emitting element provided with an electrode for wire bonding.

(1) According to one embodiment of the invention, a semiconductor light-emitting element comprises:

- a semiconductor laminated structure comprising a light-emitting layer sandwiched between first and second conductivity type layers for extracting an emitted light from the light-emitting layer on a side of the second conductivity type layer;
- a transparent electrode in ohmic contact with the second conductivity type layer;
- an insulation layer formed on the transparent electrode;
- an upper electrode for wire bonding formed on the insulation layer;
- a lower electrode that penetrates the insulation layer, is in ohmic contact with the transparent electrode and the electrode for wire bonding, and has an area smaller than that of the upper electrode in top view; and
- a reflective portion for reflecting at least a portion of light transmitted through a region of the transparent electrode not in contact with the lower electrode.

In the above embodiment (1) of the invention, the following modifications and changes can be made.

(i) The reflective portion is formed in the insulation layer so as to have a reflectance to light emitted from the light-emitting layer higher than that of the upper electrode and so as not to be in contact with the transparent electrode, the upper electrode and the lower electrode.

(ii) The upper electrode is integrally formed with the lower electrode.

(iii) The lower electrode is a pad electrode that is in ohmic contact with the transparent electrode.

(iv) The upper electrode includes a bonding region for connecting a bonding wire and a linear extension region extending from the bonding region, and
the reflective portion is formed under the bonding region and the extension region.

(v) The upper electrode includes a bonding region for connecting a bonding wire and a linear extension region extending from the bonding region, and
the reflective portion is formed under the extension region.

(vi) The upper electrode includes a bonding region for connecting a bonding wire and a linear extension region extending from the bonding region, and
the reflective portion is formed under the bonding region.

(vii) The upper electrode includes a bonding region for connecting a bonding wire and a linear extension region extending from the bonding region, and
a region of the reflective portion under the extension region is a linear region formed along a length direction of the extension region so as to have a width less than 230% of the width of the extension region.

(viii) The reflective portion is formed as a lower portion of or the entire portion of the upper electrode so that a reflectance to the light emitted from the light-emitting layer is higher than that of the lower electrode.

(ix) Adhesion of the upper electrode to the insulation layer is higher than that of the lower electrode.

(x) The first and second conductivity type layers are n-type and p-type semiconductor layers, respectively,
the first and second conductivity type layers and the light-emitting layer comprise a nitride compound semiconductor,
the transparent electrode comprises a conductive oxide, and
the lower electrode has a lower pad electrode in ohmic contact with the transparent electrode and an upper pad electrode in ohmic contact with the lower pad electrode.

(xi) The semiconductor light-emitting element further comprises:
an n-electrode comprising a lower n-electrode in ohmic contact with the first conductivity type layer and an upper n-electrode in ohmic contact with the lower n-electrode.

(xii) The upper electrode includes a bonding region for connecting a bonding wire and a linear extension region extending from the bonding region, and
the reflective portion is formed under and over the extension region.

(xiii) The upper electrode includes a bonding region for connecting a bonding wire and a linear extension region extending from the bonding region, and
the reflective portion is formed under the bonding region, and under and over the extension region.

POINTS OF THE INVENTION

According to one embodiment of the invention, a light-emitting element is constructed such that an insulation layer is formed on a p-electrode and a lower p-pad electrode in ohmic contact with the p-electrode is formed separately from an upper p-pad electrode for wire bonding. Thereby, it is possible to decrease the amount of light absorption by the pad electrode and to efficiently reflect the light, so that the light extraction efficiency of the light-emitting element can be enhanced.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Figure 1:
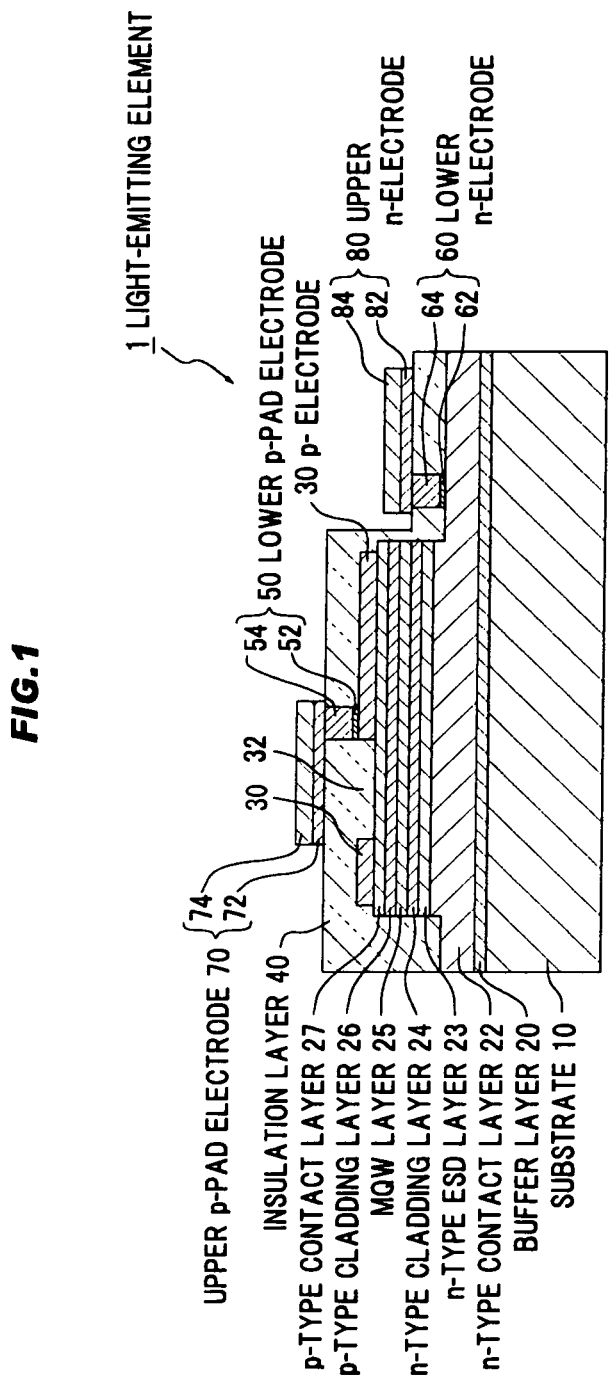
FIG. 1 is a schematic cross sectional view showing a semiconductor light-emitting element in a first embodiment of the present invention.
Figure 2:
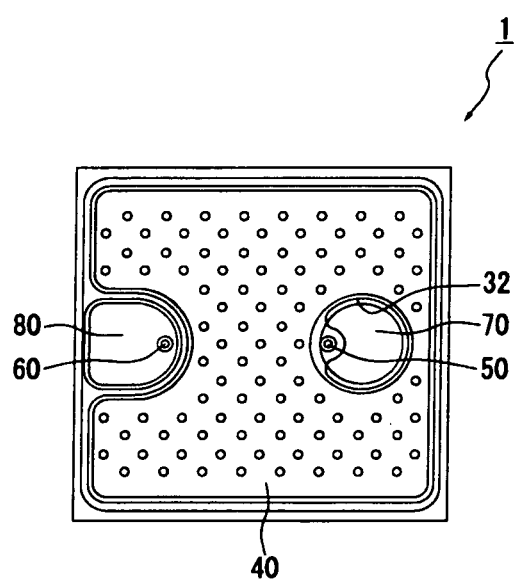
FIG. 2 is a schematic plan view showing the semiconductor light-emitting element.

FIGS. 1 and 2 show the first embodiment of the invention. FIG. 1 is a schematic cross sectional view of a semiconductor light-emitting element.

As shown in FIG. 1, a light-emitting device 1 has a semiconductor laminated structure including a sapphire substrate 10, a buffer layer 20 provided on the sapphire substrate 10, an n-type contact layer 22 provided on the buffer layer 20, an n-type ESD (Electrostatic Discharge) layer 23 provided on the n-type contact layer 22, an n-type cladding layer 24 formed on the n-type ESD layer 23, a light-emitting layer 25 provided on the n-type cladding layer 24, a p-type cladding layer 26 provided on the light-emitting layer 25 and a p-type contact layer 27 provided on the p-type cladding layer 26. In addition, a portion of from the p-type contact layer 27 to the n-type contact layer 22 is removed by etching, thereby partially exposing the n-type contact layer 22.

Here, the buffer layer 20, the n-type contact layer 22, the n-type ESD layer 23, the n-type cladding layer 24, the light-emitting layer 25, the p-type cladding layer 26 and the p-type contact layer 27 are each formed of a group III nitride compound semiconductor. For the group III nitride compound semiconductor, it is possible to use, e.g., a quaternary group III nitride compound semiconductor represented by $Al_xGa_yIn_{1-x-y}N$ ($0 \leq x \leq 1$, $0 \leq y \leq 1$, and $0 \leq x+y \leq 1$).

In the present embodiment, the buffer layer 20 is formed of AlN. Meanwhile, the n-type contact layer 22, the n-type ESD layer 23 and the n-type cladding layer 24 are each formed of n-GaN doped with respective predetermined amounts of n-type dopant (e.g., Si). And then, the light-emitting layer 25 has a multiquantum well structure including plural well layers and plural barrier layers. The well layer is formed of, e.g., GaN and the barrier layer is formed of, e.g., InGaN or AlGaN, etc. In addition, the p-type cladding layer 26 and the p-type contact layer 27 are each formed of p-GaN doped with a predetermined amount of p-type dopant (e.g., Mg).

Each layer provided on the sapphire substrate 10, from the buffer layer 20 to the p-type contact layer 27, can be formed by, e.g., a metal organic chemical vapor deposition (MOCVD) method, a molecular beam epitaxy (MBE) method or a halide vapor phase epitaxy (HVPE) method, etc. The buffer layer 20 formed of AlN is shown as an example here, however, the buffer layer 20 can be formed of GaN. The quantum well structure of the light-emitting layer 25 can alternatively be a single quantum well structure or a strained quantum-well structure instead of the multiquantum well structure.

In addition, the light-emitting element 1 includes a p-electrode 30 provided on the p-type contact layer 27 and an insulation layer 40 formed on the p-electrode 30 and on the semiconductor laminated structure. In addition, the light-emitting element 1 includes a lower p-pad electrode 50 penetrating the insulation layer 40 and being in ohmic contact with the p-electrode 30, and a lower n-electrode 60 penetrating the insulation layer 40 and being in ohmic contact with the n-type contact layer 22.

The p-electrode 30 is formed of a conductive oxide transparent to the light emitted from the light-emitting layer 25, which is ITO (Indium Tin Oxide) in the present embodiment. The p-electrode 30 is formed by using, e.g., a vacuum deposition method. Alternatively, the p-electrode 30 can be formed by a sputtering method or a CVD method, etc. In the present embodiment, the p-electrode 30 has a non-forming region 32 beneath a below-described upper p-pad electrode 70. The non-forming region 32 can be formed by etching, etc.

In the present embodiment, $SiO_2$ is used as the insulation layer 40. Alternatively, other materials may be used as the insulation layer 40, and the insulation layer 40 can be formed of, e.g., a metal oxide other than SiN, such as $TiO_2$, $Al_2O_3$ or $Ta_2O_5$, or a resin material having electrical insulation properties such as polyimide. The insulation layer 40 is formed by, e.g., the vacuum deposition method, and alternatively can be formed by a chemical vapor deposition (CVD) method. The insulation layer 40 above the p-electrode 30 and above the n-type contact layer 22 is partially removed by using photolithography technique and etching technique to form the lower p-pad electrode 50 and the lower n-electrode 60.

The lower p-pad electrode 50 includes a first metal layer 52 in contact with the p-electrode 30 and a second metal layer 54 formed on the first metal layer 52. The first metal layer 52 is formed of metal which is in ohmic contact with ITO, such as, e.g., Ni, Rh, Ti and Cr. In the present embodiment, Ni is used as the first metal layer 52 and Au is used as the second metal layer 54. In addition, the lower n-electrode 60 includes a first metal layer 62 in contact with the n-type contact layer 22 and a second metal layer 64 formed on the first metal layer 62. The second metal layer 64 is formed of metal which is in ohmic contact with the n-type contact layer 22, such as, e.g., Ni, Rh, Ti, V, Pt and Cr. In the present embodiment, the first metal layer 62 and the second metal layer 64 are formed of materials which are respectively the same as the first metal layer 52 and the second metal layer 54 of the lower p-pad electrode 50.

The lower p-pad electrode 50 and the lower n-electrode 60 are formed by, e.g., a vacuum deposition method. In the present embodiment, the material forming the lower p-pad electrode 50 is the same as the material forming the lower n-electrode 60 and the electrodes 50 and 60 are each formed by simultaneously vapor-depositing an electrode material. The lower p-pad electrode 50 may be formed of a material different from the lower n-electrode 60, and in this case, the lower p-pad electrode 50 and the lower n-electrode 60 are formed not simultaneously but separately. Alternatively, the lower p-pad electrode 50 and the lower n-electrode 60 can be formed by a sputtering method.

In addition, the light-emitting element 1 is provided with an upper p-pad electrode 70 which is formed on the insulation layer 40 and is in ohmic contact with the lower p-pad electrode 50. The upper p-pad electrode 70 is formed larger than the lower p-pad electrode 50 in plan view. The upper p-pad electrode 70 includes a first metal layer 72 in contact with the insulation layer 40 as well as with the lower p-pad electrode 50, and a second metal layer 74 formed on the first metal layer 72 and connected to a bonding wire (not shown) when mounted. The first metal layer 72 is formed of metal of which reflectance to the light emitted from the light-emitting layer 25 is higher than that of the second metal layer 74. Meanwhile, a metal suitable for connection to a bonding wire is selected for the second metal layer 74. In the present embodiment, Al is used for the first metal layer 72 and Au is used for the second metal layer 74. Alternatively, a material other than Al can be used for the first metal layer 72 and it is possible to form from, e.g., Ag, or an alloy consisting primarily of Al or Ag.

In addition, the light-emitting element 1 is provided with an upper n-electrode 80 which is formed on the insulation layer 40 and is in ohmic contact with the lower n-electrode 60. The upper n-electrode 80 is formed larger than the lower n-electrode 60 in plan view. The upper n-electrode 80 includes a first metal layer 82 in contact with the insulation layer 40 as well as with the lower n-electrode 60, and a second metal layer 84 formed on the first metal layer 82 and connected to a bonding wire (not shown) when mounted. The first metal layer 82 is formed of metal of which reflectance to the light emitted from the light-emitting layer 25 is higher than that of the second metal layer 84. Meanwhile, a metal suitable for connection to a bonding wire is selected for the second metal layer 84. In the present embodiment, the first metal layer 82 and the second metal layer 84 are formed of materials which are respectively the same as the first metal layer 72 and the second metal layer 74 of the upper p-pad electrode 70.

The upper p-pad electrode 70 and the upper n-electrode 80 have areas corresponding to a ball diameter of a bonding wire and are formed having areas larger than the lower p-pad electrode 50 and the lower n-electrode 60. That is, the lower p-pad electrode 50 and the lower n-electrode 60 are formed having areas smaller than the upper p-pad electrode 70 and the upper n-electrode 80 since the main purpose thereof is an ohmic contact with the p-electrode 30 and the n-type contact layer 22. In the present embodiment, diameters of the upper p-pad electrode 70 and the upper n-electrode 80 are 60 μm to 90 μm and diameters of the lower p-pad electrode 50 and the lower n-electrode 60 are 5 μm to 30 μm.

Meanwhile, a material of which adhesion to the insulation layer 40 is higher than that of the first metal layers 52 and 62 of the lower p-pad electrode 50 and the lower n-electrode 60 is selected for the first metal layers 72 and 82 of the upper p-pad electrode 70 and the upper n-electrode 80. Furthermore, a material of which ohmic resistance to the p-electrode 30 and the n-type contact layer 22 is smaller than that of the first metal layers 72 and 82 of the upper p-pad electrode 70 and the upper n-electrode 80 is used for the first metal layers 52 and 62 of the lower p-pad electrode 50 and the lower n-electrode 60. In addition, a material of which reflectance is higher than that of the first metal layers 52 and 62 of the lower p-pad electrode 50 and the lower n-electrode 60 is used for the first metal layers 72 and 82 of the upper p-pad electrode 70 and the upper n-electrode 80.

The upper p-pad electrode 70 and the upper n-electrode 80 are formed by, e.g., a vacuum deposition method. In the present embodiment, the material forming the upper p-pad electrode 70 is the same as the material forming the upper n-electrode 80, and the electrodes 70 and 80 are each formed by simultaneously vapor-depositing an electrode material. The upper p-pad electrode 70 may be formed of a material different from the upper n-electrode 80, and in this case, the upper p-pad electrode 70 and the upper n-electrode 80 are formed not simultaneously but separately. Alternatively, the upper p-pad electrode 70 and the upper n-electrode 80 can be formed by a sputtering method. Although it is not specifically shown in the drawing, a barrier layer may be formed between the lower p-pad electrode 50 and the upper p-pad electrode 70.

FIG. 2 is a schematic plan view showing the semiconductor light-emitting element.

As shown in FIG. 2, the light-emitting element 1 is formed in a substantially square shape when viewed from the top. The planar size of the light-emitting element 1 is, e.g., about 350 μm in length and width. In the present embodiment, the upper p-pad electrode 70 and the upper n-electrode 80 are arranged on opposite sides. In addition, the non-forming region 32 in which the p-electrode 30 is not formed is present beneath the upper p-pad electrode 70. The light-emitting element 1 emits, e.g., light having a peak wavelength of about 455 nm when forward voltage is about 3V and forward current is 20 mA.

In the light-emitting element 1 configured as described above, a bonding wire is connected to the upper p-pad electrode 70 and the upper n-electrode 80. Then, light having a wavelength in a blue region is emitted from the light-emitting layer 25 when forward voltage is applied to the upper p-pad electrode 70 and the upper n-electrode 80.

Among the light emitted from the light-emitting layer 25, the light incident on the lower p-pad electrode 50 is relatively largely absorbed by the first layer 52 which is in ohmic contact with the p-electrode 30. However, in the light-emitting element 1 of the present embodiment, since the lower p-pad electrode 50 is formed smaller than the upper p-pad electrode 70 which has an area required for wire bonding, the amount of light incident on the first layer 52 is relatively small. In addition, most of the light incident on the upper p-pad electrode 70 is reflected by the high reflective first layer 72 formed on the insulation layer 40 and does not reach the second layer 74 by which light is relatively highly absorbed.

Since the insulation layer 40 is formed on the p-electrode 30 and the lower p-pad electrode 50 in ohmic contact with the p-electrode 30 is formed separately from the upper p-pad electrode 70 for wire bonding as described above, it is possible to decrease the amount of light absorption by the pad electrode and to efficiently reflect the light, thereby improving the light extraction amount from the light-emitting element 1.

Furthermore, a material of which adhesion to the insulation layer 40 is high can be selected for the first layers 72 and 82 of the upper p-pad electrode 70 and the upper n-electrode 80 which are in contact with the insulation layer 40 and it is possible to suppress defects such as peeling, etc., of the pad electrode, hence, it is very advantageous for practical use.

In addition, since the non-forming region 32 in which the p-electrode 30 is not formed is provided beneath the upper p-pad electrode 70, relatively less amount of current flows in a region of the light-emitting layer 25 beneath the upper p-pad electrode 70 and the light emission is thereby suppressed. The light emission at the vicinity of the upper p-pad electrode 70 is suppressed as described above, and it is thereby possible to reduce the amount of the light absorbed by the upper p-pad electrode 70. Furthermore, a portion of the light emitted from the light-emitting layer 25 passes through the non-forming region 32 and the light is not absorbed at the p-electrode 30 formed of a conductive oxide, and it is thereby possible to improve light extraction efficiency of the light-emitting element 1.

In addition, since the same material is used for the electrodes on the p-side as well as on the n-side, it is possible to simultaneously form the electrodes on the p-side and the n-side, thereby reducing the manufacturing cost.

Figure 3:
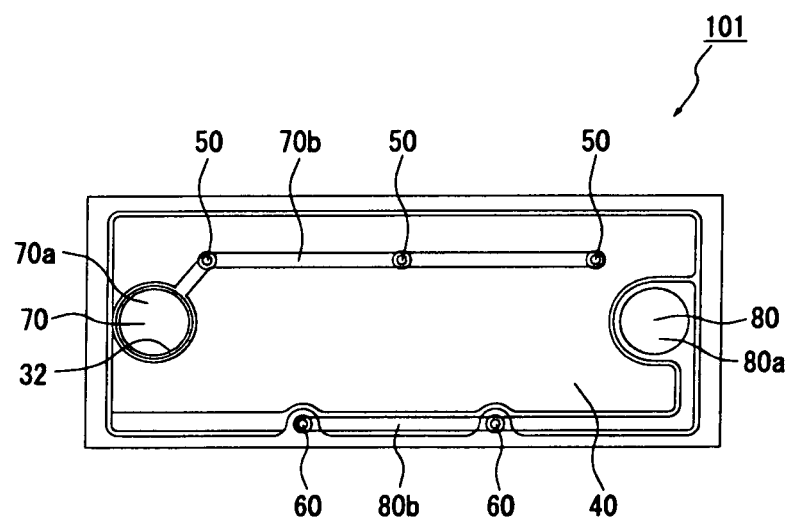
FIG. 3 is a schematic plan view showing a semiconductor light-emitting element in a modification of the first embodiment.
Figure 4:
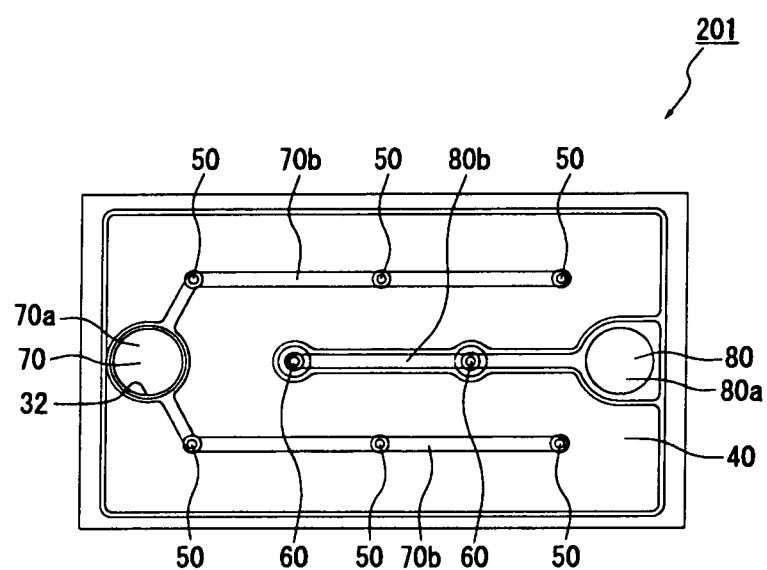
FIG. 4 is a schematic plan view showing a semiconductor light-emitting element in a modification of the first embodiment.

Although the light-emitting element 1 in a substantially square shape in plan view has been shown as an example in the above-mentioned embodiment, it may be, of course, in a substantially rectangular shape as, for example shown in FIGS. 3 and 4. In light-emitting element 101 and 201 of FIGS. 3 and 4, the upper p-pad electrode 70 and the upper n-electrode 80 have bonding wire connecting portions 70a and 80a and extending portions 70b and 80b extending from the connecting portions 70a and 80a. And the lower p-pad electrodes 50 and the lower n-electrodes 60 are connected to the extending portions 70b and 80b. Note that, the extending portions 70b and 80b are composed of only the second metal layers 74 and 84 in FIGS. 3 and 4.

In the light-emitting element 101 of the FIG. 3, the extending portions 70b and 80b of the upper p-pad electrode 70 and the upper n-electrode 80 extend along sides of the light-emitting element 101 facing each other when viewed from the top. In the light-emitting element 201 of FIG. 4, the extending portion 80b extends from one side in a predetermined direction at the middle of the light-emitting element 201 and two extending portions 70b extend from another side along the above-mentioned sides so that the extending portion 80b from the one side is located therebetween. Both the light-emitting element 101 of FIG. 3 and the light-emitting element 201 of FIG. 4 have plural lower p-pad electrodes 50 and lower n-electrodes 60 connected to the extending portions 70b and 80b to efficiently diffuse the current.

Figure 5:
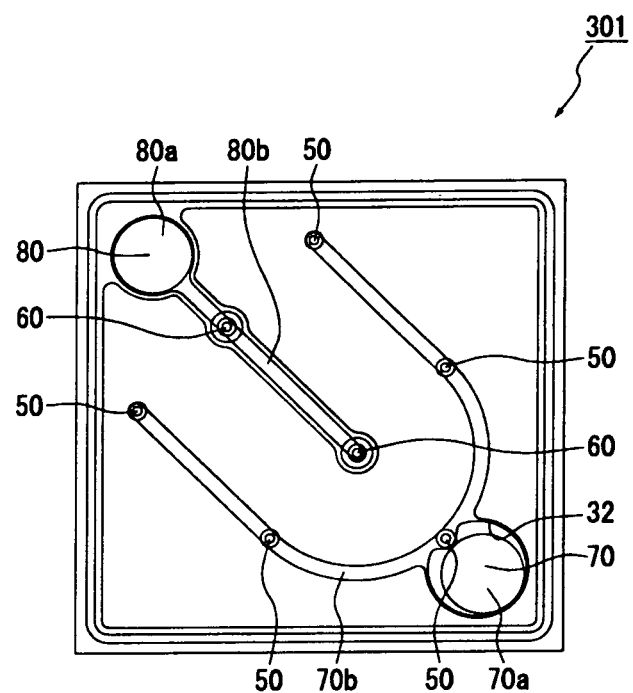
FIG. 5 is a schematic plan view showing a semiconductor light-emitting element in a modification of the first embodiment.

Meanwhile, although the upper p-pad electrode 70 and the upper n-electrode 80 arranged on the opposite sides have been described in the above-mentioned embodiment, the layout of electrodes is optional. For example, one electrode may be arranged at the middle while arranging another electrode on an outer rim side, or, the upper p-pad electrode 70 and the upper n-electrode 80 may be arranged at opposite corners as is a light-emitting element 301 shown in FIG. 5.

Figure 6:
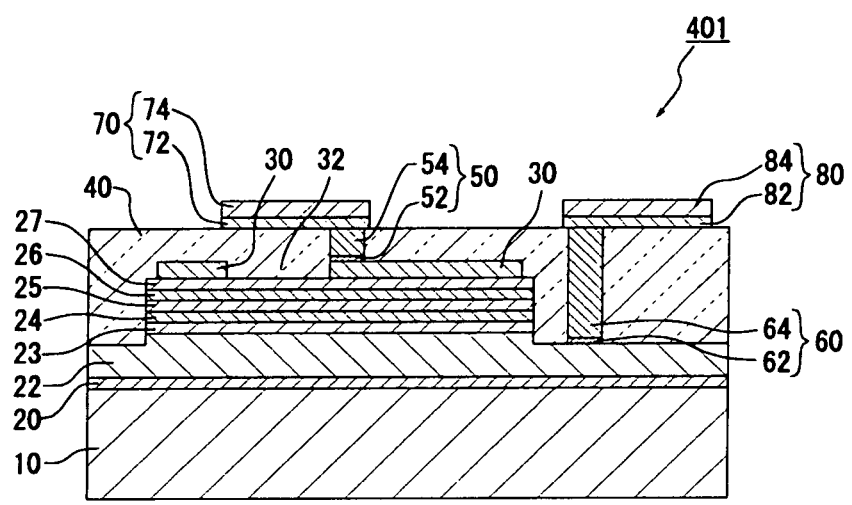
FIG. 6 is a schematic cross sectional view showing a semiconductor light-emitting element in a modification of the first embodiment.

In addition, although the upper p-pad electrode 70 and the upper n-electrode 80 located at different heights have been described in the above-mentioned embodiment, it is possible to arrange at the same height by, e.g., thickening the insulation layer 40 on the upper n-electrode 80 side as shown in FIG. 6. Since the height at which a wire is formed is the same in this case, it is very advantageous for mounting the light-emitting element 401.

In addition, although the p-electrode 30 provided with the non-forming region 32 has been described in the above-mentioned embodiment, it is evident that the non-forming region 32 may not be provided. In this case, it is possible to eliminate the etching process, etc., for providing the non-forming region 32.

In addition, although the light-emitting element in which the electrode of the invention is employed on both n- and p-sides has been described in the above-mentioned embodiment, it may be, of course, employed on one side. Furthermore, although the light-emitting element 1 which is a LED having a peak wavelength in a blue region has been described, it may be, of course, a LED having a peak wavelength in an ultraviolet or green region, etc.

In addition, the light-emitting element 1 for which a gallium nitride-based compound semiconductor is used has been described in the above-mentioned embodiment, the invention can be applied to a light-emitting element using a compound semiconductor such as GaAlAs, GaP, GaAsP and InGaAlP, etc., without departing from the gist of the present invention.

Second Embodiment

In the second embodiment of the invention, a reflective film separated from a bonding electrode is used as a reflective portion formed of a metal of which reflectance to the light emitted from the light-emitting layer 25 is high, instead of using the first metal layer 72 in the first embodiment. The explanation for the same portions as the first embodiment is omitted or simplified.

Figure 7:
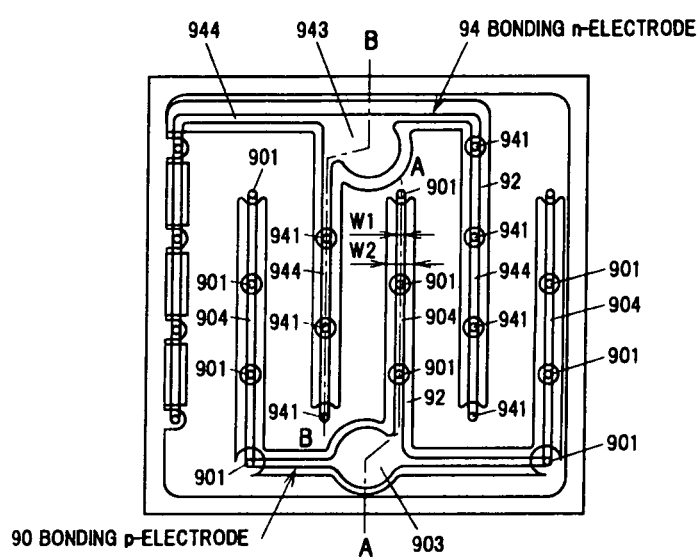
FIG. 7 is a schematic plan view showing a semiconductor light-emitting element in a second embodiment.
Figure 8A:
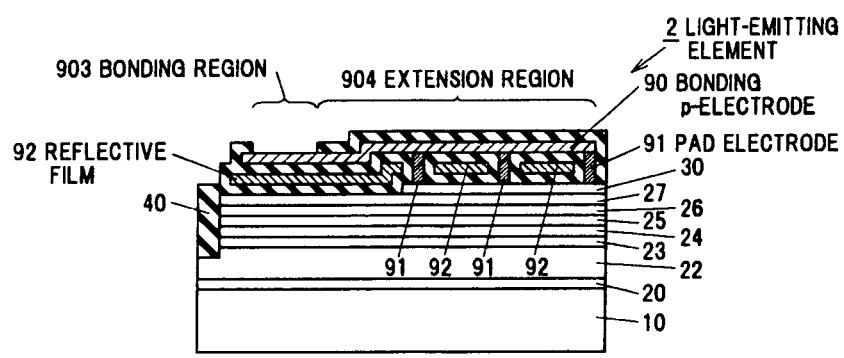
FIGS. 8A and 8B are vertical cross sectional views showing the semiconductor light-emitting element of FIG. 7.
Figure 8B:
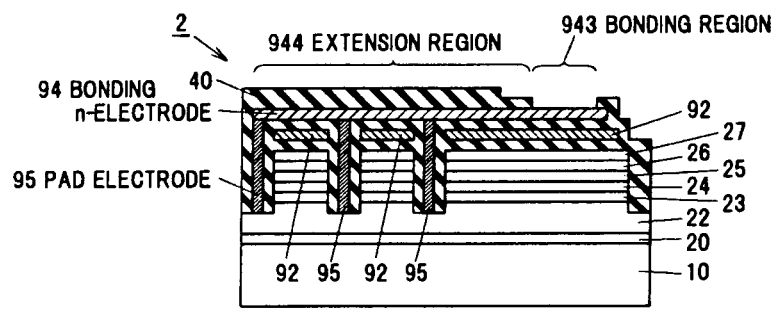

FIG. 7 is a schematic plan view of a light-emitting element 2 in a second embodiment of the invention. FIG. 8A is a vertical cross sectional view of the light-emitting element 2 taken along line A-A of FIG. 7 and FIG. 8B is a vertical cross sectional view of the light-emitting element 2 taken along line B-B of FIG. 7.

Similarly to the light-emitting element 1 in the first embodiment, the light-emitting element 2 has a semiconductor laminated structure including a sapphire substrate 10, a buffer layer 20 provided on the sapphire substrate 10, an n-type contact layer 22 provided on the buffer layer 20, an n-type ESD layer 23 provided on the n-type contact layer 22, an n-type cladding layer 24 formed on the n-type ESD layer 23, a light-emitting layer 25 provided on the n-type cladding layer 24, a p-type cladding layer 26 provided on the light-emitting layer 25 and a p-type contact layer 27 provided on the p-type cladding layer 26. In addition, a portion of from the p-type contact layer 27 to the n-type contact layer 22 is removed by etching, thereby partially exposing the n-type contact layer 22. Materials and manufacturing methods of each part of the semiconductor laminated structure are the same as those of the light-emitting element 1 in the first embodiment.

In addition, the light-emitting element 2 includes a p-electrode 30 provided on the p-type contact layer 27 and an insulation layer 40 formed on the p-electrode 30 and on the semiconductor laminated structure. Materials and manufacturing methods of the p-electrode 30 and the insulation layer 40 are the same as those of the light-emitting element 1 in the first embodiment.

Furthermore, the light-emitting element 2 is provided with a bonding p-electrode 90 which is in ohmic contact with the p-electrode 30 via a pad electrode 91, and a bonding n-electrode 94 which is in ohmic contact with the n-type contact layer 22 via a pad electrode 95.

The bonding p-electrode 90 and the bonding n-electrode 94 do not include a reflective portion equivalent to the first metal layers 72 and 82 formed of high reflective metal in the first embodiment.

Then, the bonding p-electrode 90 corresponds to the upper p-pad electrode 70 in the first embodiment and the pad electrode 91 corresponds to the lower p-pad electrode 50 in the first embodiment.

Meanwhile, the bonding n-electrode 94 corresponds to the upper n-electrode 80 in the first embodiment and the pad electrode 95 corresponds to the lower n-electrode 60 in the first embodiment.

The bonding p-electrode 90 and the bonding n-electrode 94 are respectively formed larger than the pad electrodes 91 and 95 in plan view. In other words, the areas of the bonding p-electrode 90 and the bonding n-electrode 94 are respectively larger than those of the pad electrodes 91 and 95.

In addition, the bonding p-electrode 90 has a bonding region 903 for connecting a bonding wire (not shown) and a linear extension region 904 extending from the bonding region 903. The pad electrode 91 is provided under the extension region 904. It is possible to efficiently diffuse the current into the p-electrode 30 by providing plural pad electrodes 91 under the extension region 904.

In addition, the bonding n-electrode 94 has a bonding region 943 for connecting a bonding wire and a linear extension region 944 extending from the bonding region 943. The pad electrode 95 is provided under the extension region 944. It is possible to efficiently diffuse the current into the n-type contact layer 22 by providing plural pad electrodes 95 under the extension region 944.

Metals suitable for connection to a bonding wire, e.g., Au, are used as materials of the bonding p-electrode 90 and the bonding n-electrode 94. The material of the bonding p-electrode 90 may be the same as that of the bonding n-electrode 94.

The bonding p-electrode 90 and the bonding n-electrode 94 are formed by, e.g., a vacuum deposition method or a sputtering method. When the same material is used for the bonding p-electrode 90 and the bonding n-electrode 94, it is possible to simultaneously form the bonding p-electrode 90 and the bonding n-electrode 94.

Light having a wavelength in a blue region is emitted from the light-emitting layer 25 when forward voltage is applied to the bonding p-electrode 90 and the bonding n-electrode 94. The light-emitting element 2 emits, e.g., light having a peak wavelength of about 455 nm when forward voltage is about 3V and forward current is 20 mA.

A reflective film 92 is formed of a metal of which reflectance to the light emitted from the light-emitting layer 25 is higher than that of the bonding p-electrode 90 and the bonding n-electrode 94, e.g., Al, Ag or an alloy consisting primarily of at least one of Al and Ag.

The bonding p-electrode 90 and the bonding n-electrode 94 have a relatively low reflectance to the light emitted from the light-emitting layer 25, and tend to absorb the light. However, in the light-emitting element 2 of the present embodiment, most of light traveling toward the bonding p-electrode 90 and the bonding n-electrode 94 is reflected by the reflective film 92 in the insulation layer 40 and does not reach the bonding p-electrode 90 and the bonding n-electrode 94. As described above, it is possible to improve the light extraction amount from the light-emitting element 2 by reflecting the light at the reflective film 92.

The reflective film 92 is formed at least under the bonding p-electrode 90 so as to have a shape corresponding to the shape of the bonding p-electrode 90. As a result, it is possible to reflect at least a portion of the light transmitted through a region of the p-electrode 30 not in contact with the bonding p-electrode 90.

More preferably, the reflective film 92 is formed under the bonding p-electrode 90 and the bonding n-electrode 94 so as to have a shape corresponding to the shapes thereof. As a result, it is possible to improve the light extraction amount from the light-emitting element 2.

The reflective film 92 is formed in a shape corresponding to the shapes of the bonding p-electrode 90 and the bonding n-electrode 94 so that the light traveling from the light-emitting layer 25 toward the bonding p-electrode 90 and the bonding n-electrode 94 is reflected and the light traveling in other directions is directly extracted to the outside.

For example, a region of the reflective film 92 under the linear extension region 904 of the bonding p-electrode 90 is preferably a linear region along a length direction of the extension region 904 and having a width W2 which is as close to a width W1 of the extension region 904 as possible. A lengthwise center line of the linear region of the reflective film 92 is present in a region beneath the extension region 904.

Likewise, a region of the reflective film 92 under the linear extension region 944 of the bonding n-electrode 94 is preferably a linear region along a length direction of the extension region 944 and having a width which is as close to that of the extension region 944 as possible. A lengthwise center line of the linear region of the reflective film 92 is present in a region beneath the extension region 944.

Here, an example of a relation between a width of the reflective film 92 under the extension regions 904 and 944 with respect to a width of the extension regions 904 and 944 and the light extraction amount from the light-emitting element 2 will be described using FIG. 9. In this example, the bonding p-electrode 90 and the bonding n-electrode 94 are formed of Au and the reflective film 92 is formed of Al. The widths of the extension regions 904 and 944 are each 10 µm.

Figure 9:
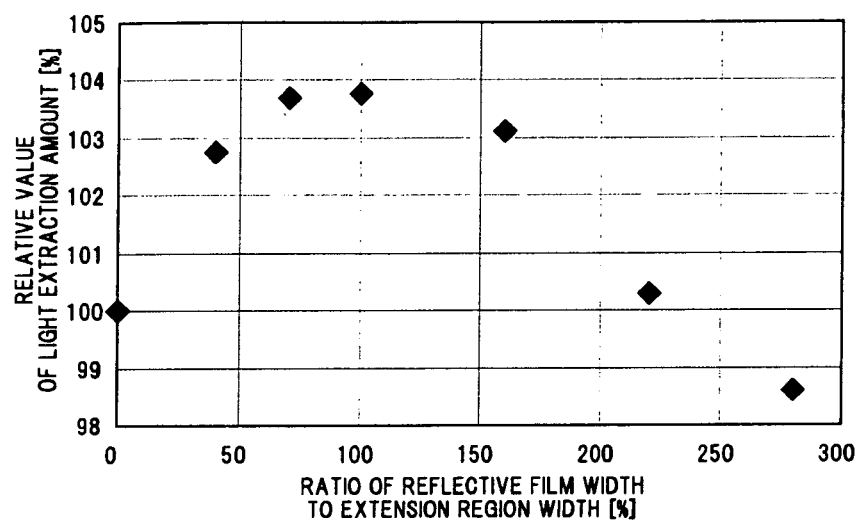
FIG. 9 is a graph in which a horizontal axis indicates a ratio of a width of a reflective film to a width of an extension region and a vertical axis indicates a light extraction amount.

FIG. 9 is a graph in which a horizontal axis indicates a ratio of the width of the reflective film 92 to the widths of the extension regions 904 and 944 and a vertical axis indicates a relative value [%] of the light extraction amount. The relative value [%] is the relative value of the light extraction amount when a value of the case without forming the reflective film 92 is defined as 100%.

As understood from FIG. 9, the light extraction amount is maximized when the widths of the extension regions 904 and 944 are equal to the width of the reflective film 92, and is reduced as the width difference becomes large. In order to obtain the effect of increasing the light extraction amount, i.e., to obtain 100% or more of the relative value of the light extraction amount, the ratio of the width of the reflective film 92 to the widths of the extension regions 904 and 944 needs to be more than 0% and less than about 230%. Furthermore, in order to extract more light, the ratio of the width of the reflective film 92 to the widths of the extension regions 904 and 944 is preferably about 25%-200%, and more preferably about 40%-160%.

Meanwhile, the reflective film 92 is formed in the insulation layer 40 so as not to contact with the p-electrode 30 and the bonding p-electrode 90. In general, electromigration is likely to occur in many of high reflective metals. Therefore, when a high reflective metal is used for a member, such as the first metal layers 72 and 82 in the first embodiment, which is connected to other conductive members, a problem occurs in that there are a few options for materials. However, since the reflective film 92 of the present embodiment is entirely covered by the insulation layer 40 and does not contact with other conductive members, there is no possibility to damage electrical characteristics of the light-emitting element 2 even if the electromigration occurs. Therefore, there are more choices for the material of the bonding p-electrode 90 than for the materials of first metal layers 72 and 82, etc. In other words, using the bonding p-electrode 90 can provide more choices for the material of a reflective portion of which reflectance to the light emitted from the light-emitting layer 25 is high.

The pad electrode 91 is formed of metal which is in ohmic contact with ITO, such as, e.g., Ni, Rh, Ti and Cr. The pad electrode 95 is formed of metal which is in ohmic contact with the n-type contact layer 22, such as, e.g., Ni, Rh, Ti, V, Pt and Cr. The material of the pad electrode 91 may be the same as that of the pad electrode 95.

The pad electrodes 91 and 95 are formed by, e.g., a vacuum deposition method or a sputtering method. When the same material is used for the pad electrodes 91 and 95, it is possible to simultaneously form the pad electrodes 91 and 95.

Figure 10:
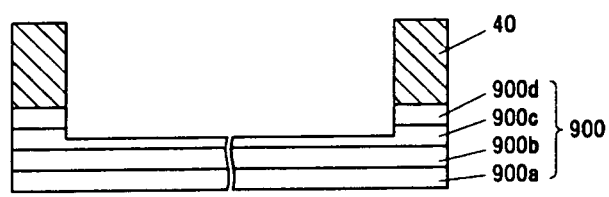
FIG. 10 is a partial enlarged view showing the vicinity of a bonding region of the light-emitting element in the second embodiment.

FIG. 10 is a partial enlarged view showing the vicinity of the bonding region 903 of the light-emitting element 2. As shown in FIG. 10, the bonding p-electrode 90 may have a multilayer structure. The multilayer structure is formed by sequentially laminating, e.g., a first layer 900a formed of Ti, a second layer 900b formed of Ni, a third layer 900c formed of Au and a fourth layer 900d formed of Al. In such a multilayer structure, a contact resistance between a bonding wire and the bonding p-electrode 90 can be reduced by exposing a low electrical resistant Au layer in the bonding region 903 and connecting the bonding wire thereto. In addition, adhesion to the insulation layer 40 formed of $SiO_2$, etc., can be improved by providing a Ti layer as the lowermost layer. Alternatively, the bonding n-electrode 94 may have such a multilayer structure in the same manner as the bonding p-electrode 90.

Figure 11A:
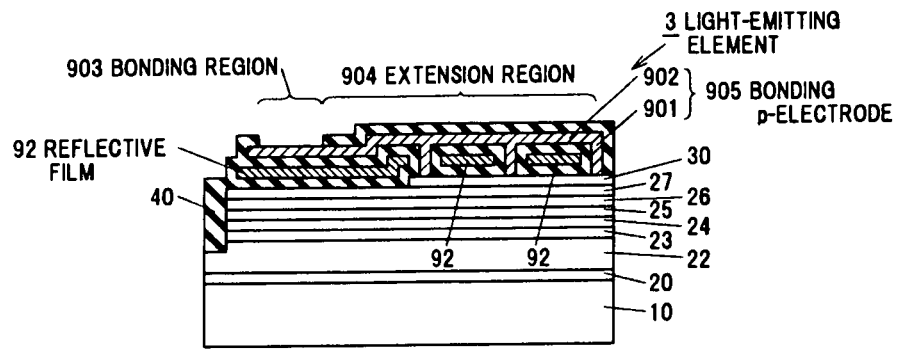
FIGS. 11A to 11C are vertical cross sectional views showing a semiconductor light-emitting element in a modification of the second embodiment.
Figure 11B:
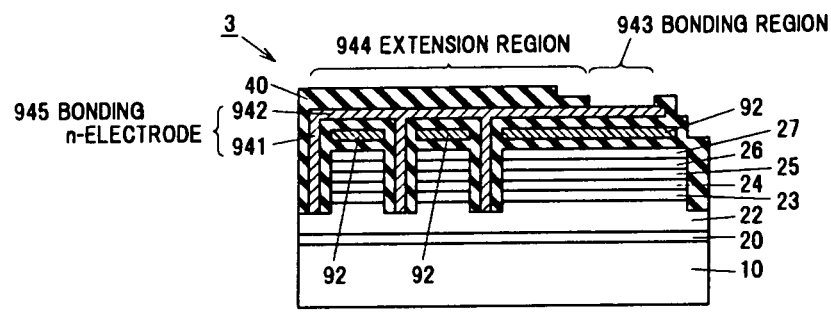
Figure 11C:
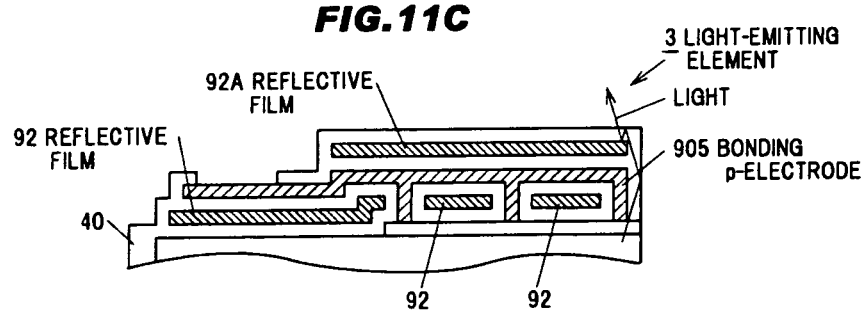

FIGS. 11A to 11C are vertical cross sectional views of a light-emitting element 3 which is a modification of the light-emitting element 2 of the present embodiment. The light-emitting element 3 is different from the light-emitting element 2 in that the pad electrodes 91 and 95 are not formed.

A bonding p-electrode 905 of the light-emitting element 3 has a lower electrode 901 corresponding to the pad electrode 91 and an upper electrode 902 corresponding to the bonding p-electrode 90. Meanwhile, a bonding n-electrode 945 of the light-emitting element 3 has a lower electrode 941 corresponding to the pad electrode 95 and an upper electrode 942 corresponding to the bonding n-electrode 94. The lower electrode 901 is integrally formed with the upper electrode 902, and the lower electrode 941 is integrally formed with the upper electrode 942.

As described above, when a bonding p-electrode (the lowermost layer in case of having a multilayer structure) is formed of a material which can appropriately contact with the p-electrode 30, the formation of the pad electrode 91 can be omitted. Meanwhile, when a bonding n-electrode (the lowermost layer in case of having a multilayer structure) is formed of a material which can appropriately contact with the n-type contact layer 22, the formation of the pad electrode 95 can be omitted.

In addition, as shown in FIG. 11C, a reflective film 92A may be further formed over the extension region 904 of the bonding p-electrode 905 such that it is formed in the insulation layer 40 so as not to contact with the bonding p-electrode 905, and parallel to the top surface of the insulation layer 40 formed on the extension region 904. In like manner, although not shown, the reflective film 92A may be formed over the extension region 944 of the bonding n-electrode 945. Thereby, a stray light (or confined light) reflected repeatedly at the interface between the light-emitting element 3 (i.e., the insulation layer 40) and the external medium (e.g., the air) can be taken out of the light-emitting element 3 by being reflected on the reflective film 92A, e.g., as shown by an arrow in FIG. 11C, so that the light extraction efficiency of the entire light-emitting element 3 can be enhanced.

Third Embodiment

The third embodiment is different from the second embodiment in that a reflective portion having a high reflectance to the light emitted from the light-emitting layer 25 is provided as lower portions of a bonding p-electrode and a bonding n-electrode (the lowermost layer of a multilayer structure) instead of providing the reflective film 92. The explanation for the same portions as the second embodiment is omitted or simplified.

Figure 12A:
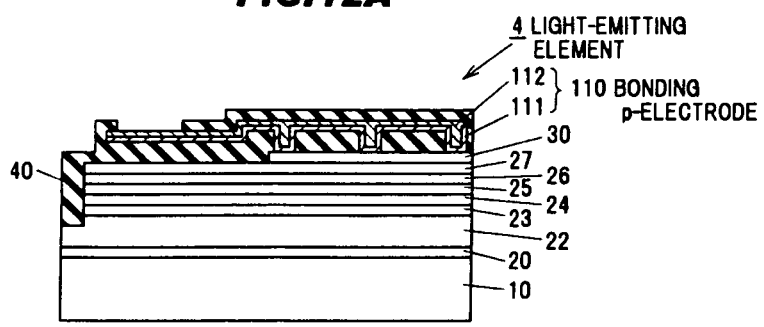
FIGS. 12A and 12B are vertical cross sectional views showing a semiconductor light-emitting element in a third embodiment.
Figure 12B:
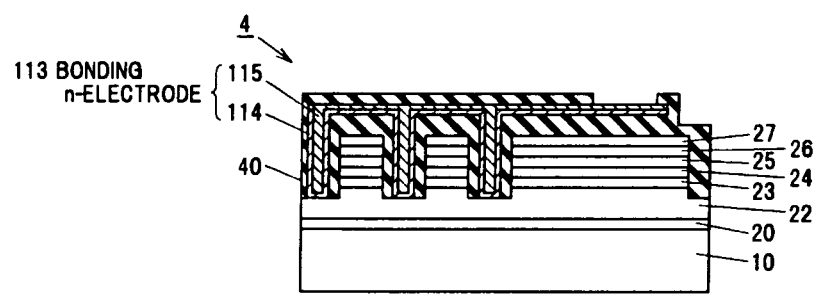

FIGS. 12A and 12B are vertical cross sectional views showing a light-emitting element 4 in the third embodiment. The layout of bonding p-electrodes and bonding n-electrodes is the same as that of the light-emitting element 2 in the second embodiment.

A bonding p-electrode 110 has a lower film 111 as a reflective portion and an upper film 112 thereon. A metal suitable for connection to a bonding wire, e.g., Au, is used as a material of the upper film 112. The lower film 111 is formed of a metal of which reflectance to the light emitted from the light-emitting layer 25 is higher than that of the upper film 112, e.g., Al, Ag or an alloy consisting primarily of at least one of Al and Ag.

Alternatively, it may be configured that the film 111 is a Ni film and the upper film 112 is a laminated film of an Au film and an Al film.

A bonding n-electrode 113 has a lower film 114 as a reflective portion and an upper film 115 thereon. A metal suitable for connection to a bonding wire, e.g., Au, is used as a material of the upper film 115. The lower film 114 is formed of a metal of which reflectance to the light emitted from the light-emitting layer 25 is higher than that of the upper film 115, e.g., Al, Ag or an alloy consisting primarily of at least one of Al and Ag.

The light which is emitted from the light-emitting layer 25 and travels toward the upper films 112 and 115 can be reflected by the lower films 111 and 114. It is thereby possible to increase the light extraction amount from the light-emitting element 4.

Although the embodiments of the invention have been described, the invention according to claims is not to be limited to the above-mentioned embodiments. Further, please note that not all combinations of the features described in the embodiments are necessary to solve the problem of the invention.

In the above-mentioned embodiment, for example, an n-type layer and a p-type layer in the semiconductor laminated structure may be the other way round. In other words, a p-type semiconductor layer may be formed instead of the n-type semiconductor layer composed of the n-type contact layer 22, the n-type ESD layer 23 and the n-type cladding layer 24, and an n-type semiconductor layer may be formed instead of the p-type semiconductor layer composed of the p-type cladding layer 26 and the p-type contact layer 27.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:
1. A semiconductor light-emitting element, comprising:
a semiconductor laminated structure comprising a light-emitting layer sandwiched between first and second con- ductivity type layers for extracting an emitted light from the light-emitting layer on a side of the second conductivity type layer;

a transparent electrode in ohmic contact with the second conductivity type layer;

an insulation layer formed on the transparent electrode;

an upper electrode for wire bonding formed on the insulation layer;

a lower electrode that penetrates the insulation layer, is in ohmic contact with the transparent electrode and the upper electrode for wire bonding, and has an area smaller than that of the upper electrode in a top view; and a reflective portion for reflecting at least a portion of light transmitted through a region of the transparent electrode that is not in contact with the lower electrode, wherein the lower electrode includes a plurality of lower electrodes that are each disposed to form an island in the top view.

2. The semiconductor light-emitting element according to claim 1, wherein the reflective portion is formed in the insulation layer so as to have a reflectance to light emitted from the light-emitting layer higher than that of the upper electrode and so as not to be in contact with the transparent electrode, the upper electrode, and the lower electrode.

3. The semiconductor light-emitting element according to claim 2, wherein the upper electrode is integrally formed with the lower electrode.

4. The semiconductor light-emitting element according to claim 2, wherein the lower electrode comprises a pad electrode that is in ohmic contact with the transparent electrode.

5. The semiconductor light-emitting element according to claim 2, wherein the upper electrode includes a bonding region for connecting a bonding wire and a linear extension region extending from the bonding region, and wherein the reflective portion is formed under the bonding region and the extension region.

6. The semiconductor light-emitting element according to claim 2, wherein the upper electrode includes a bonding region for connecting a bonding wire and a linear extension region extending from the bonding region, and wherein the reflective portion is formed under the extension region.

7. The semiconductor light-emitting element according to claim 2, wherein the upper electrode includes a bonding region for connecting a bonding wire and a linear extension region extending from the bonding region, and wherein the reflective portion is formed under the bonding region.

8. The semiconductor light-emitting element according to claim 2, wherein the upper electrode includes a bonding region for connecting a bonding wire and a linear extension region extending from the bonding region, and wherein a region of the reflective portion under the extension region comprises a linear region formed along a length direction of the extension region so as to have a width less than 230% of a width of the extension region.

9. The semiconductor light-emitting element according to claim 1, wherein the reflective portion is formed as a lower portion of or an entire portion of the upper electrode so that a reflectance to the light emitted from the light-emitting layer is higher than that of the lower electrode.

10. The semiconductor light-emitting element according to claim 9, wherein an adhesion of the upper electrode to the insulation layer is higher than that of the lower electrode.

11. The semiconductor light-emitting element according to claim 10, wherein the first and second conductivity type layers comprise n-type and p-type semiconductor layers, respectively, wherein the first and second conductivity type layers and the light-emitting layer comprise a nitride compound semiconductor, wherein the transparent electrode comprises a conductive oxide, and wherein the lower electrode comprises a lower pad electrode in ohmic contact with the transparent electrode and an upper pad electrode in ohmic contact with the lower pad electrode.

12. The semiconductor light-emitting element according to claim 11, further comprising:

an n-electrode comprising a lower n-electrode in ohmic contact with the first conductivity type layer and an upper n-electrode in ohmic contact with the lower n-electrode.

13. The semiconductor light-emitting element according to claim 2, wherein the upper electrode includes a bonding region for connecting a bonding wire and a linear extension region extending from the bonding region, and wherein the reflective portion is formed under and over the extension region.

14. The semiconductor light-emitting element according to claim 2, wherein the upper electrode includes a bonding region for connecting a bonding wire and a linear extension region extending from the bonding region, and wherein the reflective portion is formed under the bonding region, and under and over the extension region.

15. The semiconductor light-emitting element according to claim 1, wherein the plurality of lower electrodes are each disposed to form a dot in the top view.

16. The semiconductor light-emitting element according to claim 1, wherein the semiconductor light-emitting element is face-up mounted.

17. The semiconductor light-emitting element according to claim 1, wherein the insulation layer is disposed on a bottom surface of the reflective portion.

18. The semiconductor light-emitting element according to claim 16, wherein the lower electrode is disposed on the bottom surface of the reflective portion.

19. The semiconductor light-emitting element according to claim 16, wherein the bottom surface of the reflective portion comprises a lowermost surface of the reflective portion and is disposed above a top surface of the insulation layer.

20. The semiconductor light-emitting element according to claim 1, wherein the lower electrode is disposed on a bottom surface of the reflective portion.

21. The semiconductor light-emitting element according to claim 1, wherein a bottom surface of the reflective portion comprises a lowermost surface of the reflective portion and is disposed above a top surface of the insulation layer.

* * * * *